United States Patent [19]

Madurawe

[11] Patent Number: 5,729,495
[45] Date of Patent: Mar. 17, 1998

[54] DYNAMIC NONVOLATILE MEMORY CELL

[75] Inventor: Raminda U. Madurawe, Sunnyvale, Calif.

[73] Assignee: Altera Corporation, San Jose, Calif.

[21] Appl. No.: 536,026

[22] Filed: Sep. 29, 1995

[51] Int. Cl.[6] .................................................. G11C 7/02
[52] U.S. Cl. .................. 365/185.25; 365/203; 365/204; 365/185.18
[58] Field of Search ...................... 365/226, 185.25, 365/189.09, 185.01, 203, 204, 185.18

[56] References Cited

U.S. PATENT DOCUMENTS

| | | | |
|---|---|---|---|
| 4,546,273 | 10/1985 | Osman | 307/468 |
| 4,609,986 | 9/1986 | Hartmann et al. | 364/200 |
| 4,617,479 | 10/1986 | Hartmann et al. | 307/465 |
| 4,677,318 | 6/1987 | Veenstra et al. | 307/465 |
| 4,685,085 | 8/1987 | Spence | 365/190 |
| 4,713,792 | 12/1987 | Hartmann et al. | 364/90 |
| 4,823,317 | 4/1989 | Brahmbhatt | 365/189 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,121,006 | 6/1992 | Pedersen et al. | 307/465 |
| 5,241,224 | 8/1993 | Pedersen et al. | 307/465 |
| 5,260,610 | 11/1993 | Pedersen et al. | 307/465 |
| 5,260,611 | 11/1993 | Cliff et al. | 307/465 |
| 5,317,212 | 5/1994 | Wahlstrom | 307/465 |
| 5,350,954 | 9/1994 | Patel et al. | 307/465 |
| 5,375,086 | 12/1994 | Wahlstrom | 365/149 |
| 5,559,739 | 9/1996 | De Brosse et al. | 365/189.01 |
| 5,566,115 | 10/1996 | Tanaka et al. | 365/203 |
| 5,572,473 | 11/1996 | Robertson | 365/202 |
| B1 4,617,479 | 9/1993 | Hartmann et al. | 307/465 |

*Primary Examiner*—Viet Q. Nguyen
*Attorney, Agent, or Firm*—Townsend and Townsend and Crew LLP

[57] ABSTRACT

A memory cell (400) for storing data on an integrated circuit. The memory cell (400) is dynamic, nonvolatile, and reprogrammable. The layout of the memory cell is compact. A logic high output from the memory cell (400) is about VDD and a logic low output is about VSS. The memory cell (400) of the present invention includes a first programmable memory element (515). First programmable memory element (515) is coupled between a voltage source (510) and an output node (405). A charge pumping node (545) dynamically charges, through a charging transistor (525), the output node (405) to about VDD. When programmable memory element (515) is not programmed, the memory cell stores and outputs a logic low. When programmable memory element (515) is programmed, the memory cell stores and outputs a logic high. The memory cell (400) may be used to store the configuration information for a programmable logic device (121).

22 Claims, 4 Drawing Sheets

DYNAMIC NONVOLATILE MEMORY CELL

BACKGROUND OF THE INVENTION

The present invention relates to the field of integrated circuit memory technology. More specifically, the present invention provides a dynamic nonvolatile memory cell for storing data.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), application specific integrated circuits (ASICs), among others. Memory cells are used to store the data and other information for these and other integrated circuits.

As integrated circuit technology and semiconductor processing continue to advance, there is a need for greater densities and functionality in integrated circuits, which are often determined in a large part by the size of the memory cells. Further, it is desirable that the memory cells have improved operating characteristics, such as lower power consumption, nonvolatility, greater device longevity, improved data retention, better transient performance, superior voltage and current attributes, and improvements in other similar attributes.

Furthermore, improved memory cells are especially needed for particular applications, such as PLD integrated circuits. PLDs are well known to those in the electronic art. Such programmable logic devices are commonly referred as PALs (Programmable Array Logic), PLAs (Programmable Logic Arrays), FPLAs, PLDs, EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, and FLEX® 8000 EPLDs made by Altera Corp.

PLDs are generally known in which many logic array blocks (LABs) are provided in a two-dimensional array. LABs contain a number of individual programmable logic elements (LEs) which provide relatively elementary logic functions such as NAND, NOR, and exclusive OR. Further, PLDs have an array of intersecting signal conductors for programmably selecting and conducting logic signals to, from, and between the LABs and LEs. The configuration of the LABs, LEs, and interconnections between these logical elements is stored in memory cells. Memory cells may be used to programmably control the composition, configuration, and arrangements of logic array blocks (LABs) and logic elements (LEs) and also the interconnections between these logic array blocks and logic elements.

Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks. Also as PLDs increase in size and complexity, greater numbers of memory cells are required to hold the configuration information of the logical elements.

While such devices have met with substantial success, such devices also meet with certain limitations, especially in situations in which the provision of more complex logic modules and additional or alternative types of interconnections between the logic modules would have benefits sufficient to justify the additional circuitry and programming complexity. There is also a continuing demand for logic devices with larger capacity. This produces a need to implement logic functions more efficiently and to make better use of the portion of the device which is devoted to interconnecting individual logic modules. Moreover, there is a need to more efficiently and effectively store the configuration information of PLDs. The memory technology used to store the configuration information of the PLD should be compact, power efficient, reprogrammable and nonvolatile, require little additional programming circuitry overhead, and generally provide enhancements to the performance and features of PLD logic modules and interconnections.

As can be seen, an improved memory cell is needed, especially an improved memory cell for storing the configuration information for the logic elements and interconnections of a programmable logic device.

SUMMARY OF THE INVENTION

The present invention provides a dynamic, nonvolatile, and reprogrammable memory cell for storing data in an integrated circuit. The memory cell includes a programmable memory element coupled between a voltage source and an output node. During normal operation, the voltage source is at about VSS. The output node outputs the stored state of the memory cell. A charging transistor is coupled between a charge pumping node and the output node. The charge pumping node dynamically charges, through the charging transistor, the output node to about VDD. The charge at the output node is periodically refreshed.

To store a logic high, the programmable memory element is programmed, which decouples the output node from the voltage source. Output node will remain at VDD. To store a logic low, the programmable memory element is erased, which couples the output node to the voltage source. The dynamic charge at the output node is discharged through the programmable memory element to the voltage source. Output node will be at VSS.

The programmable memory element may be NMOS and programmable. In one embodiment, Flash EEPROM or EEPROM transistors may be used to achieve RAM-type operation. IF ROM-type operation is desired, EPROM, fuse, or antifuse technology can be employed. During a read operation, a control gate of the programmable memory element is held at a fixed (nonswitching) voltage.

In one embodiment, the memory cell delivers full-rail or approximately full-rail power supply voltages at its output, without consuming static power other than leakage currents. The memory cell of the present invention is both dynamic (requiring periodic refreshing) and nonvolatile (retaining its memory if power is removed). It can be used as a standard RAM cell, where one bit or a string of bits may be read at a time; or as a configuration bit whose output drives multiplexers or other circuitry such as when used in programmable logic devices. Furthermore, the memory cell may be used to store the configuration information of a programmable logic device. The memory cell also provides good data retention characteristics.

More specifically, the memory cell of the present invention includes: a charge pumping node; and a charging device coupled between the charge pumping node and an output node, where a precharge signal is coupled to the charge pumping node to charge the output node to a first voltage level through the charging device. Further, a memory device is coupled between a voltage source at a second voltage level and the output node, where the second voltage level is below the first voltage level. The memory stores data and retains this data when power is removed from the integrated circuit.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
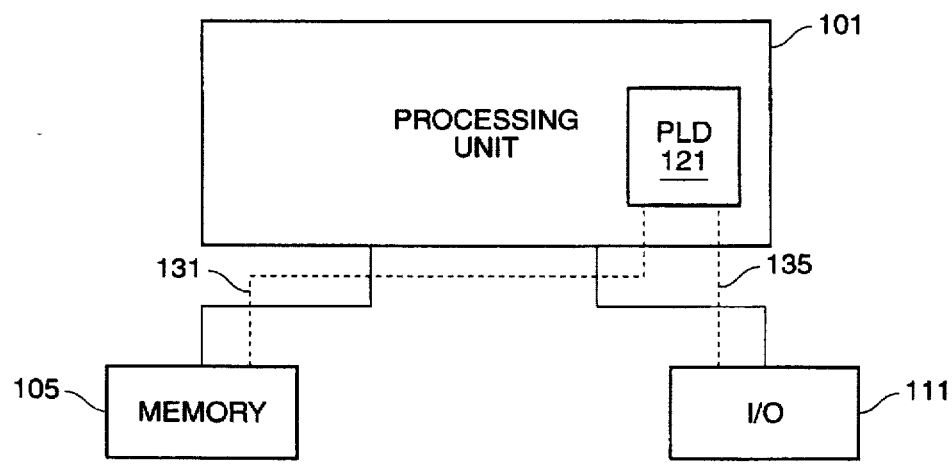
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
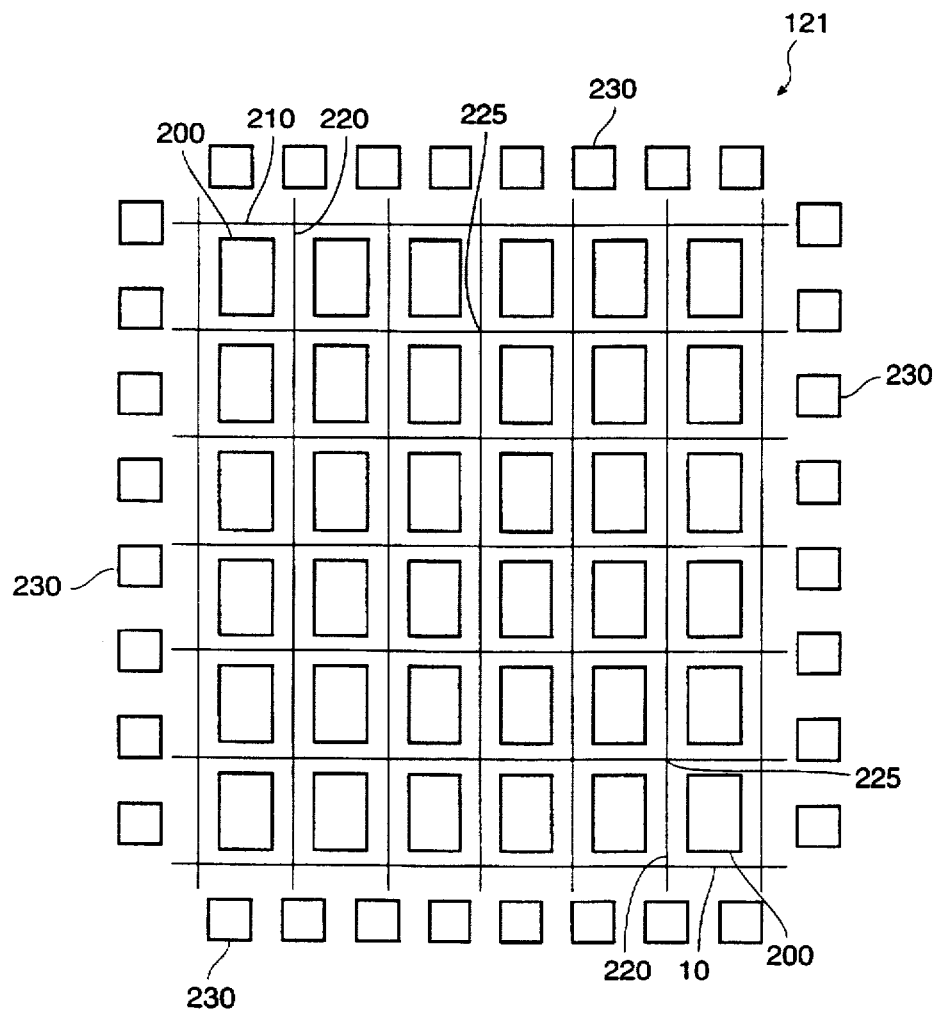
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Generally, in the future, as technology advances and improves, programmable logic devices with even greater numbers of logic array blocks will undoubtedly be created. Furthermore, LABs 200 need not be organized in a square matrix; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver. An input driver takes signals from outside the chip and interfaces them to on-chip circuitry. An output drive takes internal signals and interfaces them to the outside world. A bidirectional driver performs the functions of both a input driver and an output driver. In addition, a bidirectional drive has a high-impedance mode which allows the driver to interface with a bidirectional bus. In other embodiments of the present invention, a PLD may have dedicated input drivers and dedicated output driver, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3:
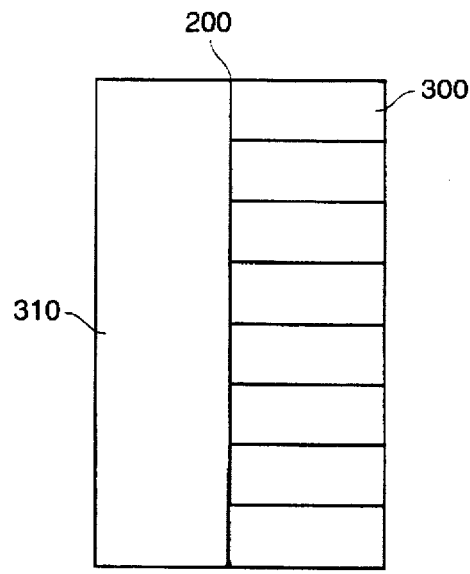
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has separate inputs, outputs, control signals, and carry chains.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

The memory cell of the present invention may be used in various places in a PLD. For example, the memory cell may be used to implement and store the configuration of a look-up table, function generator, programmable interconnect, and other components of the PLD. Using the memory cell of the present invention, a RAM may be constructed that will be used to implement the look-up tables used in LEs 300. The memory cell of the present invention may also be as a storage bit. This storage bit may be used, for example, to determine whether an LE is in registered or sequential mode. The storage bit may also be used to configure the operation of a programmable multiplexer.

Figure 4:
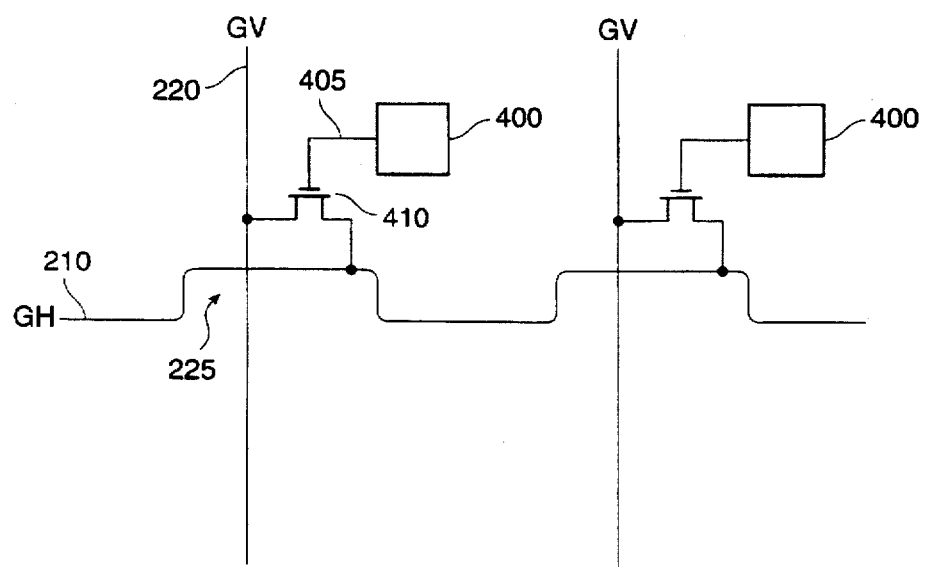
FIG. 4 is a diagram of the memory cell of the present invention used in the programmable interconnect of a programmable logic device.

FIG. 4 is a diagram showing an example of how the present invention may be used in the implementation of the programmable interconnection resources of a PLD, such as shown in FIG. 2. Memory cell 400 is a programmable memory cell of the present invention. Memory cell 400 stores a logic state, either a high or low logic state. Typically, a logic high state is represented by a "one" or VDD, while a logic low state is represented by a "zero" or ground.

Memory cell 400 is reprogrammable, which means that the cell may be programmed many times with new data. Furthermore, in the present invention, memory cell 400 is nonvolatile, which means that the stored information is retained even when power is removed. For example, after memory cell 400 is programmed with a particular logic state, memory cell 400 stores this information indefinitely until the cell is reprogrammed.

Memory cell 400 has an output node 405 for outputting its stored state. Output node 405 provides either a logic low output or a logic high output, representative of the state stored in memory cell 400. The output voltage levels at output node 405 are typically full-rail voltages, equal to either about VDD (sometimes referred to as VCC) or VSS of the integrated circuit.

Memory cell 400 may be used to implement many types of logic elements and components. For example, memory cell 400 may be used to implement a flip-flop, register, storage bit, architecture bit, lookup table, programmable interconnect array, RAM, SRAM, ROM, EPROM, EEPROM, content-addressable memory (CAM), PLD, FPGA, PC Card memory card, and other similar memory elements and devices. As shown in FIG. 4, memory cell 400 may be used to implement the programmable interconnection resources of a PLD.

In FIG. 4, GH 210 and GV 220 conductors cross at intersections 225. Intersections 225 are sometimes referred to as crosspoints. As is typically the case with global programmable interconnect, GH 210 and GV 220 lines do not connect at intersections 225 unless they are programmably coupled. A pass transistor 410 and programmable memory cell 400 facilitate the programmable coupling of GH 210 to GV 220, and vice versa. In particular, depending on the data stored in memory cell 400, GH 210 and GV 220 conductors are programmably connected or programmably disconnected at intersection 225.

At intersection 225, pass transistor 410 is coupled between GH 210 and GV 220. A gate of pass transistor 410 is coupled to output node 405 of memory cell 400. Controlled by way of memory cell 400, pass transistor 410 programmably couples GH 210 to GV 220. For example, GV 220 and GH 210 may be connected together by storing a logic high in memory cell 400. Memory cell 400 would output a high level at output node 405, which is passed to the gate of pass transistor 410. A high at the gate of pass transistor 410 turns pass transistor 410 on, so that GV 220 is electrically coupled to GH 210. In the alternative, GV 220 and GH 210 may be disconnected from another by programming a zero into memory cell 400. In this manner, memory cell 400 of the present invention may be used to implement a global programmable interconnect structure for a PLD.

Furthermore, as discussed earlier, the present invention may provide full-rail voltages at the gate of pass transistor 410. In this case, pass transistor 410 will be either substantially on or substantially off. This allows GHs 210 and GVs 220 to conduct signals throughout the integrated circuit with generally good performance characteristics. For example, when pass transistor 410 is fully on (e.g., the gate is at VDD), the amount of resistance of pass transistor 410 is kept at a minimum, thus improving transient performance. Also, VDD at the gate of pass transistor 410 allows a voltage of about VDD–VT (a threshold voltage of pass transistor 410, including body effect) from one GH 210 or GV 220 conductor to another. Also, when pass transistor 410 is fully off (e.g., the gate is at VSS), no signals will pass (or "leak") from GH 210 or GV 220 conductor to another. Further, when pass transistor 410 is fully off, the GV 220 conductors intersecting a particular GH 210 conductor will not capacitively load that particular GH 210 conductor. These features improve the performance of the programmable logic device integrated circuit.

Pass transistor 410 may be fabricated using many different process technologies, including CMOS, NMOS, PMOS, and bipolar. In a preferred embodiment, pass transistor 410 is an NMOS transistor.

Figure 5:
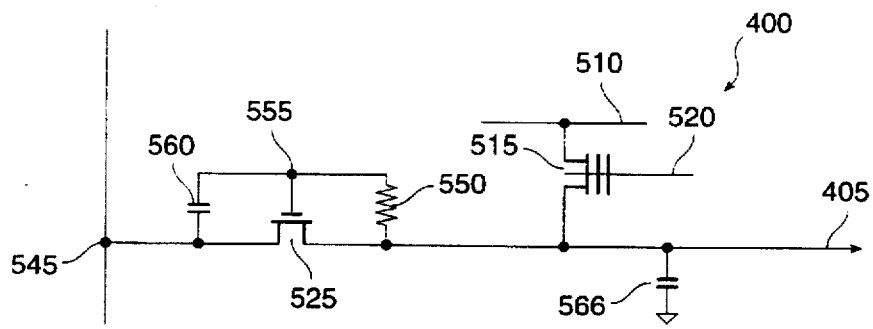
FIG. 5 is a block diagram of a memory cell of the present invention.

FIG. 5 shows a more detailed block diagram of memory cell 400 of the present invention. Memory cell 400 stores a logic state. Memory cell 400 outputs this stored logic state, a logic high or a logic low, onto output node 405. For an integrated circuit, the logic high may be represented by a first voltage level, and the logic low may be represented by a second voltage level. The first voltage level is generally the supply voltage for the integrated circuit, VDD (or VCC). The second voltage level is about VSS. VDD is typically 5 volts and VSS is ground. Furthermore, to facilitate highly integrated semiconductor circuits, the typical voltage supply of 5 volts has been reduced to a voltage level less than 5 volts, commonly from about 3.3 volts to 3.6 volts. In the future, supply voltages may even be reduced even further to, for example, 2.5 volts or lower.

Furthermore in an embodiment, the supply voltages for memory cell 400 may not the same as the supply voltages for the integrated circuit. In this case, the first voltage level may not be about VDD. The second voltage level may not be about VSS. For example, VDD may be about 5 volts, but this voltage may be reduced to about 3.3 volts for coupling to the internal circuits. In this case, the first voltage level may be a "local" VDD, a VDD which is coupled to memory cell 400 and possibly other internal circuitry. In another example, the supply voltage of the integrated circuit may be VDD, but the first voltage level for memory cell 400 may be about VDD–VT. In yet another example, VDD may be about 3.3 volts, and the first voltage level for memory cell 500 may be a higher voltage, about 5 volts.

Memory cell 400 includes a programmable memory element 515 coupled between a voltage source 510 and output node 405. Programmable memory element 515 may be a nonvolatile memory element, which may be fabricated from many different memory technologies. Nonvolatile memory cells retain their stored information even when power is removed. For example, programmable memory element 515 may be fabricated using one-time programmable devices such as fuses or antifuses. Furthermore, programmable memory element 515 may be fabricated using nonvolatile, reprogrammable memory devices such as EPROM, EEPROM, Flash EEPROM, and the like. In a preferred embodiment, programmable memory element 515 is an EEPROM cell. In this embodiment, programmable memory element 515 has a control gate 520. Voltage source 510 is generally coupled to the second voltage level, or VSS, of the integrated circuit.

Further, in memory cell 400, a charging transistor 525 is coupled between a charge pumping node 545 and output node 405. Charging transistor 525 may be formed using many different types of transistors including bipolar and MOS devices. In a preferred embodiment, charging transistor 525 is an NMOS transistor.

A resistor 550 is coupled between a gate 555 of charging transistor 525 and output node 405. On an integrated circuit, a resistor may be fabricated using many different techniques and from different devices. For example, resistor 550 may be formed using polysilicon, undoped polysilicon, n-type diffusion, p-type diffusion, n-well diffusion, a transistor channel, among others. Resistor 550 may also be integrated with charging transistor 525 or formed from the layout of the interconnect. For example, in a layout, resistor 550 may be a serpentine polysilicon interconnect between gate 555 of charging transistor and output node 405. In one embodiment, resistor 550 is approximately 100 Kohms. However, resistor 550 may be as small as for example, 10 ohms if certain constraints (described below) are satisfied.

A capacitor 560 is coupled between gate 555 of charging transistor 525 and charge pumping node 545. On an integrated circuit, a capacitor may be formed using many different techniques and from different devices. For example, depending on the process technology, a capacitor may formed using the gate capacitance of a transistor, polysilicon to metal conductor capacitance, n-well diffusion to substrate, among others. In a preferred embodiment, capacitor 560 is formed using the gate overlap capacitance of charging transistor 525. A capacitor 566 is coupled between output node 405 and ground. As the case with capacitor 560, capacitor 566 may be fabricated using many different techniques and from different devices. In one embodiment, capacitor 566 is the total capacitance at output node 405, which includes the capacitance contributed by the gates, junctions, and parasitic capacitances coupled to output node 405. From example, in the embodiment shown in FIG. 4, capacitor 566 includes the capacitance of the gate of pass transistor 410.

In operation, memory cell 400 stores and outputs a logic low or logic high. Data is stored in memory cell 400 by programming programmable memory element 515. Programmable memory element 515 has two states, programmed or erased (not programmed). Depending on the memory technology used, the terms "programmed" and "erased" may have different meanings. In this specification, the IEEE convention for these terms is used. Specifically, "programmed" refers to placing a memory element into an "off" or nonconducting state, and "erased" refers to placing a memory element into an "on" or conducting state. In the programmed state, programmable memory element 515 decouples voltage source 510 from output node 405. In the erased state, programmable memory element 515 couples voltage source 510 to output node 405.

Memory cell 400 produces an output representative of the data stored in programmable memory element 515 at output node 405. A precharge signal, described in more detail below, is input at charge pumping node 545. This precharge signal may also be referred to as a refresh signal. In response to the precharge signal, a small amount of precharge current is passed from charge pumping node 545 through charging transistor 525 to output node 405. This dynamically charges (or precharges) output node 405 to the first voltage level, or about VDD. When programmable memory element 515 is programmed, output node 405 will be decoupled from voltage source 510. Output node 405, dynamically held at the first voltage level, will be a logic high. Capacitor 566 stores the charge at output node 405. On the other hand, when programmable memory element 515 is erased, output node 405 is coupled through programmable memory element 515 to voltage source 510. The precharge current at output node 405 is discharged to voltage source 510, or VSS. Consequently, output node 405 will be at the second voltage level, a logic low. In this embodiment, memory cell 400 of the present invention may provide full-rail voltage output at output node 405.

Memory cell 400 of the present invention may also include features to allow the programming and erasure of programmable memory element 515. More specifically, EPROM, EEPROM, Flash EEPROM cells have floating gates to provide for nonvolatility and reprogrammability. To program and erase these cells, high voltages may be used to transfer charge to and remove charge from the floating gates through the silicon dioxide by various physical mechanisms such as avalanche injection, channel injection, quantum-mechanical tunneling, hot electrons, and other phenomena.

A high voltage (VPP) used to program the memory cells may be somewhat different from a high voltage (VEE) used to erase the memory cells. The magnitude of VPP and VEE depends on the physical characteristics of the memory cell including such considerations as the thickness and composition of the dielectric between the substrate and the floating gate. Typically, VPP and VEE voltages are in the range of approximately 12 volts to 14 volts. However, as process technology continues to improve, it will become possible to fabricate thinner and better dielectrics. Consequently, the high voltages needed to program and erase the memory cells may decrease in magnitude.

For EEPROM and Flash EEPROM memory cells, to erase the cells, charge is electrically removed from the floating gate using high voltages and quantum-mechanical tunneling. For EPROM memory cells, charge is removed from the floating gates by exposing the cells to radiation, such as ultraviolet light; exposing EPROM memory cells to ultraviolet light neutralizes the charge in the floating gate. After erasure, EPROM, EEPROM, and Flash EEPROM memory cells may be reprogrammed. EPROM and Flash EEPROM memory cells are generally programmed using hot electrons, while EEPROM cells are programmed using quantum-mechanical tunneling. In some cases, Flash EEPROM memory cells are programmed using quantum-mechanical tunneling. EPROM, EEPROM, and Flash memory cells may be programmed, erased, and reprogrammed many times.

When EPROM, EEPROM, and Flash EEPROM memory cells are programmed, charge placed on the floating gate and a memory cell is placed in a high voltage threshold (VT) state (VTP). In the programmed or high VT state, a reasonable voltage on a gate of the memory cell will not turn the memory cell on. In this case, a reasonable voltage is a voltage between the supplies of the integrated circuit, VDD and VSS. Furthermore, in the case when a voltage above voltage source 510 is placed on the gate, the memory cell may turn on. For example, for EPROM, EEPROM, and Flash EEPROM memory cells, the typical threshold voltage for a memory cell in a high VT state is approximately 4 volts. However, the high VT state may also be above 4 volts. For example, for EPROM memory cells, the high VT state may be about 7 volts. When programmed using an "assist" technique (described below), the high VT state for EEPROM memory cells may be somewhat higher then 4 volts.

In contrast, when erased, charge is removed from the floating gate and the memory cell is placed in a low VT state (VTE). In the erased or low VT state, a reasonable voltage on a gate of the memory cell will turn the memory cell on. For EEPROM and Flash EEPROM memory cells, the typical threshold voltage for a memory cell in a low VT state ranges from approximately −2 volts to −3 volts. For EPROM memory cells, the typical threshold voltage in a low VT state is zero volts or slightly above zero volts.

When EEPROM or Flash EEPROM cells are erased using a "smart" algorithm, a specific low VT voltage level state may be achieved. For example, the VTE may be about −1 volts. In another example, the VTE may be zero volts or slightly above zero volts. A smart algorithm removes charges from the floating gate using an iterative technique, removing small amounts of charge until a desired VTE is achieved. A smart algorithm may be used to prevent a negative VTE, especially important in some applications where a negative VTE is undesirable such as for high-density, high-capacity Flash EEPROM memories. In other applications such as programmable logic devices, a negative low VT state may be allowable because, among other reasons, the memory cell may be accessed using a read transistor in series with the memory cell. The present invention does not require the use of a smart algorithm since memory cell 400 operates and functions properly when programmable memory element 515 has a negative VTE.

Also, when an array of EPROM or Flash EEPROM memory cells is initialized, the cells are erased to a low VT state. For example, an EPROM array is initialized when exposed to ultraviolet light. Flash EEPROM memory cells are initialized when bulk erased. However, when an array of EEPROM memory cells is initialized, the cells typically may be programmed to a high VT state. The initiation state of a memory array is chosen based on many considerations including the fabrication of the memory cell devices themselves and the intended use for the memory cells.

Control gate 520 activates programmable memory element 515. During normal operation, control gate 520 is coupled to a voltage level which activates and enables operation of programmable memory element 515. Until activated, programmable memory element 515 decouples voltage source 510 from output node 405. To activate programmable memory element 515, control gate 520 is coupled to a third voltage level which is greater than VTE and less than the VTP. For example, for a typical EEPROM cell, control gate 520 should above about −1.5 volts (VTE) and less than about 4 volts (VTP). In a preferred embodiment of the present invention, to provide the greatest amount of programming and erase margin, the third voltage level is selected at a voltage at approximately in the center of VTE and VTP. For example, for a typical EEPROM memory cell, control gate 520 is set in the range from about 1.7 volts to about 2 volts. As a further example, for an EPROM memory cell, where VTE equals about zero volts and VTP equals about 7 volts, control gate 520 may be tied to the first voltage level, or VDD, or a higher voltage level. A activation voltage above VDD may be used because for example, this may be required by the memory element, or a higher voltage level is readily available. Control gate 520 is also used during the programming programmable memory cell 515. Further discussion of programming of the programmable memory cell 515 is given below.

Figure 6:
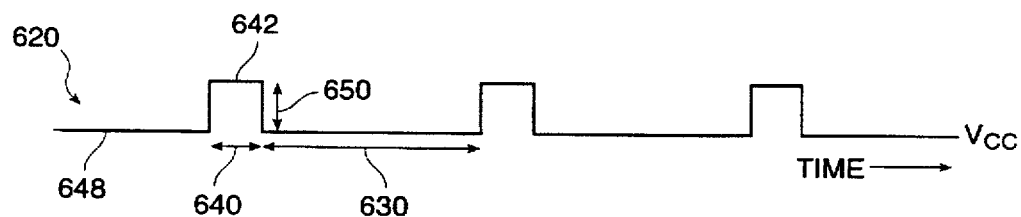
FIG. 6 is a timing diagram for a precharge signal waveform for the memory cell of the present invention.

FIG. 6 shows a timing diagram for a precharge signal 620 that is coupled to charge pumping node 545. Precharge signal 620 is a periodic signal that is provided at charge pumping node 545 during the normal operation of memory cell 400. Precharge signal 620 dynamically charges output node 405 to about the first voltage level.

Precharge signal 620 is at about the first voltage level during a Toff 630 time period. For a Ton 640 time period, precharge signal 620 has a pulse 642 to a fourth voltage level 645 above the first voltage level 648. A period of precharge signal 620 is Ton+Toff. A ΔV 650 is a difference between first voltage level 648 and fourth voltage level 645. ΔV 650 may be about 3.5 volts. For the following discussion, please refer also to FIG. 5. During the Ton 640 time period, the gate 555 of charging transistor 525 is coupled to the fourth voltage level. Charging transistor 525 turns on slightly, passing a precharge current $I_{T1}$ from charge pumping node 545 to output node 405. This precharge current may be on the order of microamps. In one embodiment, the precharge current is about two microamps.

Pulse 642 is chosen to meet the following constraints. $V_{T1}$ is the threshold voltage for charging transistor 525. More specifically, $V_{T1}$ is the voltage at gate 555 to turn charging transistor 525 on slightly. The capacitances of memory cell 400 are related to $V_{T1}$ as follows:

$$\Delta V_g = (C1/(C1+Cg))^* \Delta V \cong V_{T1}.$$

ΔVg is the voltage coupling to gate 555 as a result of pulse 642. ΔVg is related to ΔV 650 by a capacitive divider of the capacitances at gate 555. C1 represents the capacitance of capacitor 560. Cg represents the gate capacitance of charging transistor 525.

During Ton 640, resistor 550 provides adequate isolation from output node 405 such that the gate voltage of charging transistor 525 does not equilibrate with the voltage at output node 405 to turn charging transistor 525 off. More specifically, the voltage at gate 555 is coupled through capacitor 560 to a voltage ΔVg above its initial voltage. Resistor 550 provides an RC delay so that the ΔVg voltage change and pulse 642 does not filter through to output node 405. Therefore, during Ton 640, there may be a voltage difference between gate 555 and output node 405. This maintains charging transistor 525 in the on state. While charging transistor 525 is on, the precharge current $I_{T1}$ charges output node 405 by an amount ΔVb. The above relationships are expressed by:

$$(R1^*Ct) > (Ct^*(\Delta Vb/I_{T1})) \text{ and}$$

$$Ton = Ct^* \Delta Vb/I_{T1}.$$

Ct represents the capacitance of capacitor 566. R1 represents the resistance of resistor 550. R1 may be any value, so long as the necessary RC delay is obtained. For example, in one embodiment, R1 is ten ohms.

During Toff 630, the current flow through resistor 550 should allow the gate voltage of charging transistor 525 to equilibrate with the voltage at output node 405. In particular, during normal operation (at steady state mode), output node 405 will be at approximately the first voltage level 648 (at charge pumping node 545) plus a VT. Through the resistor 550 feedback connection to gate 555 of the charging transistor 525, the memory cell of the present invention is self-regulating to maintain this particular voltage. For example, if the voltage goes above this value, the precharge current through 525 will be reduced slightly to maintain a constant voltage level at output node 405. In fact, current may flow from output node 405 through charging transistor 525 to charge pumping node 545 if the voltage at output node 405 becomes extremely high. If cases where the voltage at output node 405 goes below the particular value, the precharge current through 525 will be increased slightly to maintain a constant voltage level at output node 405. This relationship is given by:

$$(R1*(C1+Cg))<Toff.$$

To minimize power consumption for the integrated circuit, the charging current $I_{T1}$ and a leakage current through charging transistor 525 (Ijleak) should remain a relatively small source of power consumption for the chip. $I_{T1}$ represents the current through charging transistor 525 and programmable element 515, when programmable element 515 is erased. Ijleak represents the current required to keep output node 405 at VDD+VT, when programmable element 515 is programmed. An integrated circuit may contain a number of memory cells 400, N, where N may be as high as one million memory cells 400 or more. In this case, the total time average current should be less than one milliamp. A portion, N1, of the memory cells is programmed and a portion, N2, is erased. The sum of N1 and N2 equals to N. Therefore, $$(N1*I_{T1}*(Ton/Ton+Toff)))+(N2*Ijleak*Toff/(Ton+Toff))<1\text{ mA}$$

By solving the above equations, many possible solutions for the design of the memory cell parameters may be found. For example, the following set of parameters satisfies the above constraints:

| | | |
|---|---|---|
| $Ct = 20$ fF | $C1 = 0.5$ fF | $Cg = 1.5$ fF |
| $V_{T1} = 1$ V | $\Delta V = 4$ V | $\Delta Vb = 0.1$ V |
| $I_{T1} = 1$ μA | $Ton = 50$ ns | $Toff = 1$ ms |
| $R1 = 1$ MOhm | $N = 1$ million | |

As shown by these parameters, the pulse duration Ton may be substantially shorter in duration than Toff.

When initially charging output node 405, the voltage at this node slowly rises until output node 405 is at approximately the first voltage level 648 plus a VT. In one embodiment, output node 405 may be charged to about this level in about twenty pulses 648 of precharge signal 620. The charging time to initialize output node 405 may be about one millisecond. Depending on the frequency of precharge signal 620 and the specific parameters of the design, this time may be more or less than one millisecond. An array of memory cells 400 may be charged using a common precharge signal 620. This simplifies the implementation of a design using memory cell 400 of the present invention.

Furthermore, pulse 642 of precharge signal 620 may be staggered for different rows and columns of memory cells 400. By staggering pulse 642 of precharge signal 620, less current is required to precharge the array at any instant in time. For example, a row of memory cells 400 may be precharged with a first precharge signal 620, then another row of memory cells 400 may be precharged with a second precharge signal 620, which is staggered with respect to first precharge signal 620. This means that pulse 642 of second precharge signal 620 and does not occur at the same time as pulse 642 of first precharge signal 620. More specifically, pulse 642 of second precharge signal 620 may occur at some time after pulse 642 of first precharge signal 620. As a further example, for an array with three hundred columns of memory cells 400, precharge signal 620 will be staggered for the different columns to minimize the instantaneous current drain. The current drain per column of memory cells 400 may be one milliamp, which will be the instantaneous precharge current drain for the entire chip. Consequently, by staggering precharge signal 620, larger arrays of memory cells 400 may be built.

After output node 405 has been charged, when programmable memory element 515 is in the off state, voltage source 510 is decoupled from output node 405. The precharge signal 620 provides a voltage boost (pulse 642) at output node 405 to maintain this voltage level at about VDD+VT. This voltage boost also offsets any leakage current at output node 405, sufficient to maintain VDD+VT at output node 405. Furthermore, in the configuration shown in FIG. 4, since VDD+VT is provided at the gate of pass transistor 410, this allows the passage of full-rail signals between GHs 210 and GVs 200, which also provides improved transient performance.

When programmable memory element 515 is in the off state, there is a reduced electric field between the floating gate and channel of programmable memory element 515. Specifically, when a floating gate memory cell (such as an EEPROM or Flash EEPROM) is used, the floating gate is not subjected to a channel-to-substrate bias (referred to as floating gate disturb phenomena). In the present invention, the channel of programmable memory element 515 is at zero volts or cutoff. A channel-to-substrate bias generates electron-hole pairs. These electrons are attracted to the floating gate, which disturb the memory cell and reduce the lifetime of the device. Therefore, memory cell 400 of the present invention has excellent data retention and reliability characteristics, even when VDD is 5 volts.

When programmable memory element 515 is in the on state, voltage source 510 is coupled from output node 405. Therefore, the voltage at output node 405 is VSS. Consequently, charging transistor 525 is off. There is no DC path from charge pumping node 545 to VSS through charging transistor 525 and programmable memory element 515. During pulse 642, the precharge current $I_{T1}$ through charging transistor 525 will be discharged to voltage source 510 through programmable memory element 515. Output node 405 will remain at about the level of voltage source 510, typically VSS. $I_{T1}$ and Ton 640 should be minimized to reduce the amount of current discharged through programmable memory element 515 and also reduce the power consumption of the integrated circuit.

Figure 7:
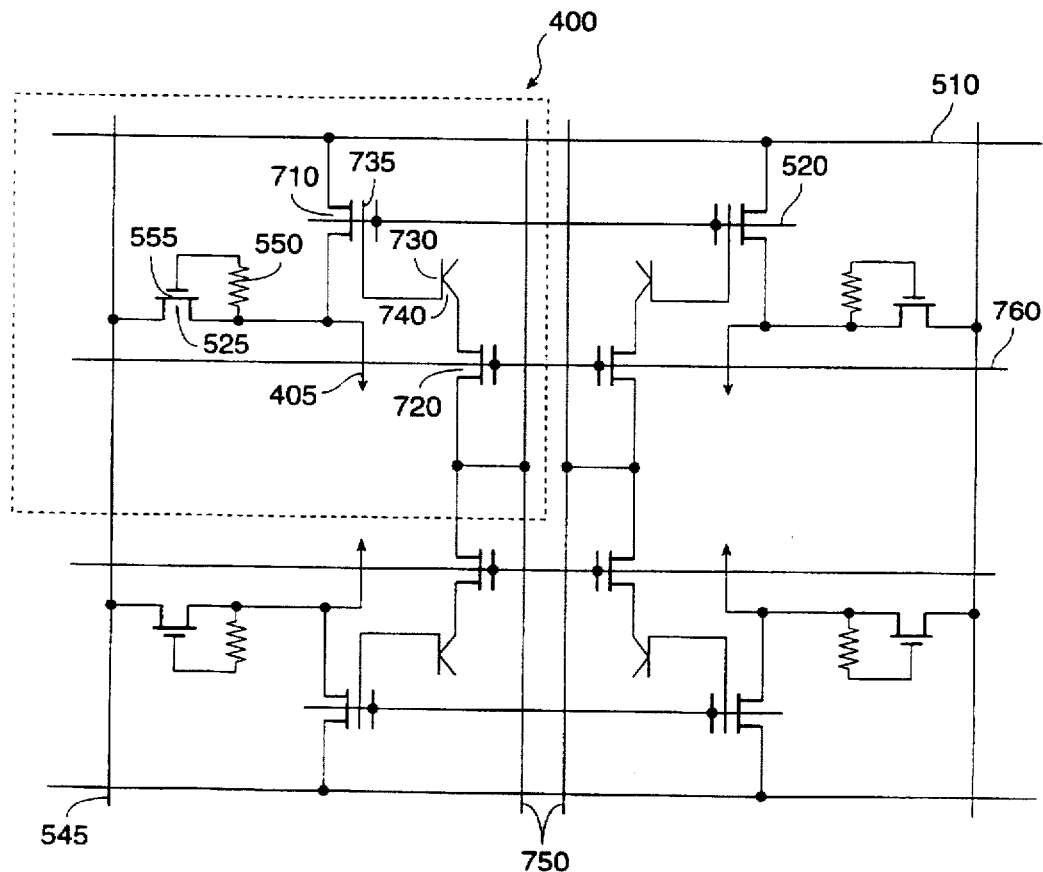
FIG. 7 is a diagram of showing a small array of memory cells of present invention implemented using EEPROM cells.

FIG. 7 shows a layout of an array of memory cells 400. In this embodiment, memory cells 400 are implemented using EEPROM memory cells. FIG. 7 shows four memory cells 400. Larger arrays of memory cells 400 may be constructed using a similar layout methodology.

Memory cell 400 of FIG. 7 is an embodiment of memory cell 400 of FIG. 5. In FIG. 7, programmable memory element 515 is implemented using a single- or double-polysilicon EEPROM cell 710. Further, memory cell 400 of FIG. 7 includes additional transistors and signal lines to provide for the programming of EEPROM cell 710. In order to simplify the diagram, capacitor 560 and capacitor 566 are not shown. However, these capacitances are present in memory cell 400 of FIG. 7 at the locations as show in FIG. 5. These capacitances also serve the same purposes as described earlier.

Memory cell 400 includes the following devices: EEPROM cell 710, resistor 550, charging transistor 525, and a select transistor 720. Furthermore, memory cell 400 has a tunnel dielectric 730 for transferring electrons from a tunnel diode 740 to a floating gate 735 of EEPROM cell 710. EEPROM cell 710 is coupled between voltage source 510 and output node 405. EEPROM cell 710 has a control gate 520. Charging transistor 525 is coupled between charge pumping node 545 and output node 405. The gate 555 of charging transistor 525 is coupled through resistor 550 to output node 405. Select transistor 720 is coupled between tunnel diode 740 and a erase node 750. Select transistor has a select gate 760.

Memory cell 400 of FIG. 5 operates substantially similarly to memory cell 400 of FIG. 7. EEPROM cell 710 is configured to store the data of memory cell 400. Data stored in memory cell 400 is output at output node 405. When initialized, an array of EEPROM cells is bulk programmed to a high VT state. A typical VTP for an EEPROM cell is about 4 volts to 5 volts. In a high VT state, an EEPROM cell decouples its drain terminal from its source terminal. When erased to a low VT state, an EEPROM cell couples its drain terminal to its source terminal. A typical VTE for EEPROM cells is about −1.5 volts. The smart algorithm described above may also be used to erase EEPROM cells to obtain a VTE of about zero volts.

By appropriately configuring EEPROM cell 710, memory cell 400 will store a logic high or logic low. For the present invention, as discussed earlier, output node 405 is dynamically charged to the first voltage level or VDD by a precharge current from charge pumping node 545 through charging transistor 525. To store a logic high, EEPROM cell 710 remains programmed. Then, output node 405 will be dynamically charged and held by capacitor 566 at about the first voltage level. The voltage at output node 405 will be periodically refreshed by precharge signal 620. To store a logic low, EEPROM cell 710 is erased. The charge at output node 405 will be discharged through EEPROM cell 710 to voltage source 510. Output node 405 will be approximately equal voltage source 510, which is at the second voltage level or VSS. Hence, memory cell 400 outputs an output low.

Control gate 520 activates the EEPROM cell 710. As discussed, during normal operation, control gate 520 is set at a voltage between the VTE and VTP of EEPROM cell 710 to maximize the amount of programming and erase margin. In one embodiment, this voltage is in the range from approximately 1.7 volts to 2 volts.

Control gate 520 is also used during the programming of EEPROM cell 710. To initialize (or program) EEPROM cell 710, control gate 520 is set to VPP. Erase node 750 is grounded. Select gate 760 is set at a voltage to turn on select transistor 720. Select gate 720 is typically set to a voltage of about 2 volts, although any voltage in the range from 2 volts to VDD will also turn on select transistor 720. Voltage source 510 and charge pumping node 545 are grounded. Under these conditions, electrons will tunnel from tunnel diode 740 through tunnel dielectric 730 into floating gate 735 of EEPROM cell 710. Floating gate 735 becomes negatively charged so that EEPROM cell 710 is programmed to the high VT state. This is done globally to program all bits in an array of EEPROM cells 710.

By using an assist programming technique, VTP may be boosted to a higher value. For assist programming, voltage source 510 is set to an assist voltage of about VDD. Charge pumping node 545 is allowed to float. Since control gate 520 is at VPP, output node 405 is also at about VDD. Charging pumping node 545 will float to VDD–VT through charging transistor 525 (which is on). Under these conditions, there is additional voltage coupling to floating gate 735 through the channel of EEPROM cell 710 that boosts the initial voltage of the floating gate. When the initial voltage of the floating gate is higher, the resulting VTP voltage will be higher.

Consequently, more electrons become trapped in floating gate 735 than under the programming conditions without assist. Hence, floating gate 735 is programmed to a higher VTP level. Furthermore, the assist voltage may be above VDD to increase the voltage coupling to floating gate 735. For example, the assist voltage may be about VPP.

EEPROM cells are programmed using quantum-mechanical tunneling. By using quantum-mechanical tunneling, substantially less current is needed to program EEPROM cells than for example, Flash EEPROM cells, which are typically programmed using hot electrons. EEPROM cells are programmed primarily due to the magnitude of the high voltages across very thin dielectrics (typically seventy to eighty angstroms of oxide). Therefore, since high currents are not necessary, the use of EEPROM cells generally provides integrated circuits which may be configured while resident on a system board—sometimes referred to as in-system programming (ISP)—where large currents are often unavailable.

Quantum-mechanical tunneling is also the mechanism used to erase EEPROM cell 710. EEPROM cells are selectively erased. For example, to erase EEPROM cell 710, select gate 760 is set to VEE+VT (a threshold voltage of select transistor 720). Erase node 750 is coupled to VEE. Control gate 520 and voltage source 510 are grounded. VEE is passed through select transistor 720 to tunnel diode 740. Electrons from floating gate 735 of EEPROM cell 710 are attracted through tunnel dielectric 730 into tunnel diode 740. This removes electrons from floating gate 735 of EEPROM cell 710. Thus, EEPROM 710 is erased to a low VT state. For an array of EEPROM cells 710, this operation is repeated in a row-by-row or column-by-column basis until the desired pattern is imprinted into the array.

When erasing EEPROM cells 710, a negative assist programming technique may be used by placing a negative assist voltage on control gate 520. For example, a voltage of −3 volts may be placed on control gate 520. This would decrease VTE, improving the erase margin of EEPROM cell 710.

An array of EEPROM cells may be monitored to verify the program and erase states of the bits. To verify the program margin, the erase nodes 750 are grounded. The voltage sources 510 are set to about 2 volts one at a time. The voltage at a control gate 520, corresponding to the row of cells being verified, is swept until an EEPROM cell 710 begins conducting and the charge pumping nodes 545 begin conducting. This procedure allows the verification of one row of EEPROM cells 710 at a time. All of the bits in that row are verified through the charge pumping nodes 545.

FIG. 7 also shows how the layout of an array of memory cells 400 may be organized and compacted to save integrated circuit area. There are a plurality of signals in a first direction and a plurality of signals in a second direction. The signals in the first direction are substantially transverse to the signals in the second direction. In the first direction, the signals include voltage source 510, control gate 520, and select gate 760. In the second direction, the signals include charge pumping node 545, output node 405, and erase node 750.

This configuration provides for efficient layout and routing of the signal lines of memory cells 400. Furthermore, the arrangement of the signals facilitates the efficient routing of signals in the integrated circuit. For example, note that a control gate 520 signal line is shared by a row of EEPROM cells. Also, on erase node 750 is shared by a column of EEPROM cells. These features allow a more compact layout. Further, the signals lines are arranged so that the EEPROM cells may be easily initialized to a high VT state in a single operation.

The control lines of the present invention are organized using a grid system. This allows easier programming, erasing, and reading of memory cells 400. For example, memory cells 400 may be configured many bits at a time until the array of memory cells 400 is configured. Specifically, after providing VEE+VT at select gate 760 and grounding control gate 520, memory cells 400 may be selectively configured by providing VEE and ground on the appropriate erase nodes 750. Using this technique, a plurality of memory cells 400 to be configured at the same time.

Figure 8:
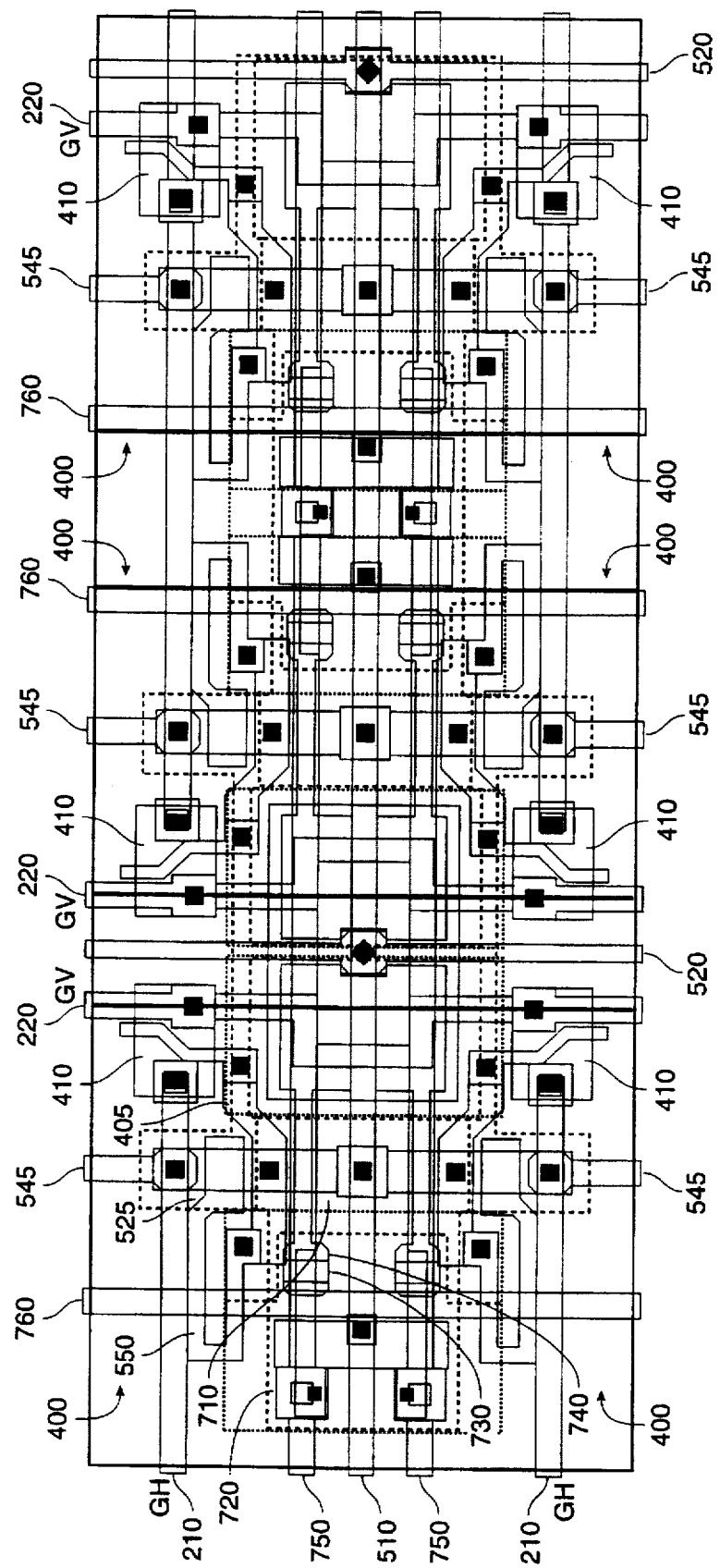
FIG. 8 is a layout of an array of memory cells of the present invention used to implement a programmable interconnect.

FIG. 8 shows a layout of an implementation of the programmable interconnect circuit of FIG. 4. In FIG. 8, memory cell 400 is implemented using EEPROM memory cells, as shown in FIG. 7. There are six EEPROM memory cells 400 and six pass transistors 410. Larger arrays may be constructed by repeating and mirroring the structures and geometries in horizontal and vertical directions.

For a memory cell 400, pass transistor 410 is coupled between GH 210 and GV 220. A polysilicon gate of pass transistor 410 is coupled to output node 405 of memory cell 400. GHs 210 run in a first direction of the layout, while GVs 220 run in a second direction of the layout, transverse to the first direction. Memory cell 400 is comprised of EEPROM cell 710, resistor 550, charging transistor 525, and select transistor 720. In this embodiment, resistor 550 is formed using polysilicon. In the first direction of the layout, the signals for this memory cell are voltage source 510, erase node 750, and GH 210. In the second direction of the layout, the control signals are select gate 760, charge pumping node 545, control gate 520, and GV 220. Select transistors 720 are coupled to the floating gate 735 of their respective EEPROM cells 710 via tunnel window 730 and tunnel diode 740.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A memory cell for an integrated circuit comprising:
   a charge pumping node;
   a charging device coupled between said charge pumping node and an output node, wherein a precharge signal is coupled to said charge pumping node to charge said output node to a first voltage level through said charging device; and
   a memory element, coupled between a voltage source at a second voltage level and said output node, wherein said second voltage level is below said first voltage level, wherein said memory element stores data and retains said data when power is removed from said integrated circuit.

2. The memory cell of claim 1 wherein said output node is periodically refreshed by said precharge signal.

3. The memory cell of claim 1 wherein a cycle of said precharge signal has a first level at about said first voltage level and a second level at a third voltage level, above said first voltage level.

4. The memory cell of claim 1 wherein a cycle of said precharge signal comprises a pulse, wherein said pulse is at a third voltage level, above said first voltage level, wherein a duration of said pulse is substantially shorter than a duration when said precharge signal is at about said first voltage level.

5. The memory cell of claim 1 wherein said output node is dynamically held above about said first voltage level in a first state, and is discharged to about said second voltage level in a second state.

6. The memory cell of claim 1 further comprising a resistor coupled between a gate of said charging device and said output node.

7. The memory cell of claim 1 further comprising a capacitor coupled between said output node and ground.

8. The memory cell of claim 1 further comprising a capacitor coupled between a gate of said charging device and said charge pumping node.

9. A memory cell for an integrated circuit comprising:
   a nonvolatile memory element, coupled between a voltage source and an output node;
   a charge pumping node; and
   a charging transistor, coupled between said charge pumping node and said output node, wherein a precharge signal, coupled to said charge pumping node, periodically refreshes said output node to about a first voltage level, wherein said voltage source is at about a second voltage level, below said first voltage level.

10. The memory cell of claim 9 wherein in an on state, said nonvolatile memory element programmably couples said voltage source to said output node, said output node is at about said second voltage level.

11. The memory cell of claim 9 wherein said precharge signal is at about said first voltage level, wherein said precharge signal provides a pulse rising from said first voltage level to a third voltage level, above said first voltage level.

12. The memory cell of claim 9 wherein a pulse of said precharge signal turns said charging transistor on, passing a precharge current from said charge pumping node to said output node.

13. The memory cell of claim 9 wherein when said nonvolatile memory element is in an on state, a precharge current from said charge pumping node is discharged through said nonvolatile memory element.

14. The memory cell of claim 9 wherein in an off state, said nonvolatile memory element decouples said voltage source from said output node, said output node is dynamically charged to about said first voltage level.

15. The memory cell of claim 9 further comprising a resistor coupled between a gate of said charging transistor and said output node.

16. The memory cell of claim 9 further comprising a capacitor coupled between said output node and ground.

17. The memory cell of claim 9 further comprising a capacitor coupled between a gate of said charging transistor and said charge pumping node.

18. The memory cell of claim 9 wherein said nonvolatile memory element is a floating gate device.

19. The memory cell of claim 9 wherein said nonvolatile memory element is an EEPROM device.

20. The memory cell of claim 9 wherein said nonvolatile memory element is a Flash device.

21. A programmable logic device with a memory cell as recited in claim 9.

22. A system with a memory cell as recited in claim 9.

* * * * *